US012686913B2

(12) United States Patent (10) Patent No.: US 12,686,913 B2
Lin et al. (45) Date of Patent: Jul. 21, 2026

(54) DEVICES AND METHODS FOR DEPOSITION

(71) Applicant: Taiwan Semiconductor Manufacturing Company, Ltd., Hsinchu (TW)

(72) Inventors: Yung-Chen Lin, Hsinchu (TW); Wen-Bin Lai, Hsinchu (TW); Yi-Ping Tsai, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/897,436

(22) Filed: Sep. 26, 2024

(65) Prior Publication Data

US 2026/0085399 A1 Mar. 26, 2026

(51) Int. Cl.
*C23C 14/50* (2006.01)
*C23C 14/54* (2006.01)

(52) U.S. Cl.
CPC ............ *C23C 14/50* (2013.01); *C23C 14/541* (2013.01); *C23C 14/542* (2013.01)

(58) Field of Classification Search
None
See application file for complete search history.

(56) References Cited

U.S. PATENT DOCUMENTS

| | | | | |
|---|---|---|---|---|
| 2008/0305634 | A1* | 12/2008 | Igarashi | .................... C23C 4/01 118/45 |
| 2015/0024147 | A1* | 1/2015 | Lee | ................... H01J 37/32623 118/723 R |
| 2022/0181195 | A1* | 6/2022 | Lin | ..................... C23C 16/4585 |

* cited by examiner

*Primary Examiner* — Shamim Ahmed
*Assistant Examiner* — Bradford M Gates
(74) *Attorney, Agent, or Firm* — Lippes Mathias LLP

(57) ABSTRACT

Devices and methods for performing physical vapor deposition (PVD) include a process chamber. The process chamber includes a wafer holder, an annular shield with a vertical sidewall around a central opening, a clamp having a plurality of alignment pins extending from the lower surface and passing through the pin openings in the annular shield; and a heater configured to pass through the central aperture of the wafer holder. Each alignment pin may have a length such that a lower end of the alignment pin does not contact the annular shield at a process position where the heater and the clamp engage the associated wafer substrate and the hoop does not engage the clamp. The clamp may include a groove that engages the vertical sidewall of the annular shield in a release or rest position.

20 Claims, 8 Drawing Sheets

DEVICES AND METHODS FOR DEPOSITION

BACKGROUND

Integrated circuits are formed on a semiconductor wafer. Photolithographic patterning processes use ultraviolet light to transfer a desired mask pattern to a photoresist on a semiconductor wafer. Etching processes may then be used to transfer to the pattern to a layer below the photoresist. This process is repeated multiple times with different patterns to build different conductive, resistive, and/or insulating layers on the wafer substrate and make a useful semiconductor device. Different deposition methods, including physical vapor deposition (PVD), are used for building these layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8 is a plan view of one embodiment of a deposition device, containing multiple process chambers.

DETAILED DESCRIPTION

Figure 1:
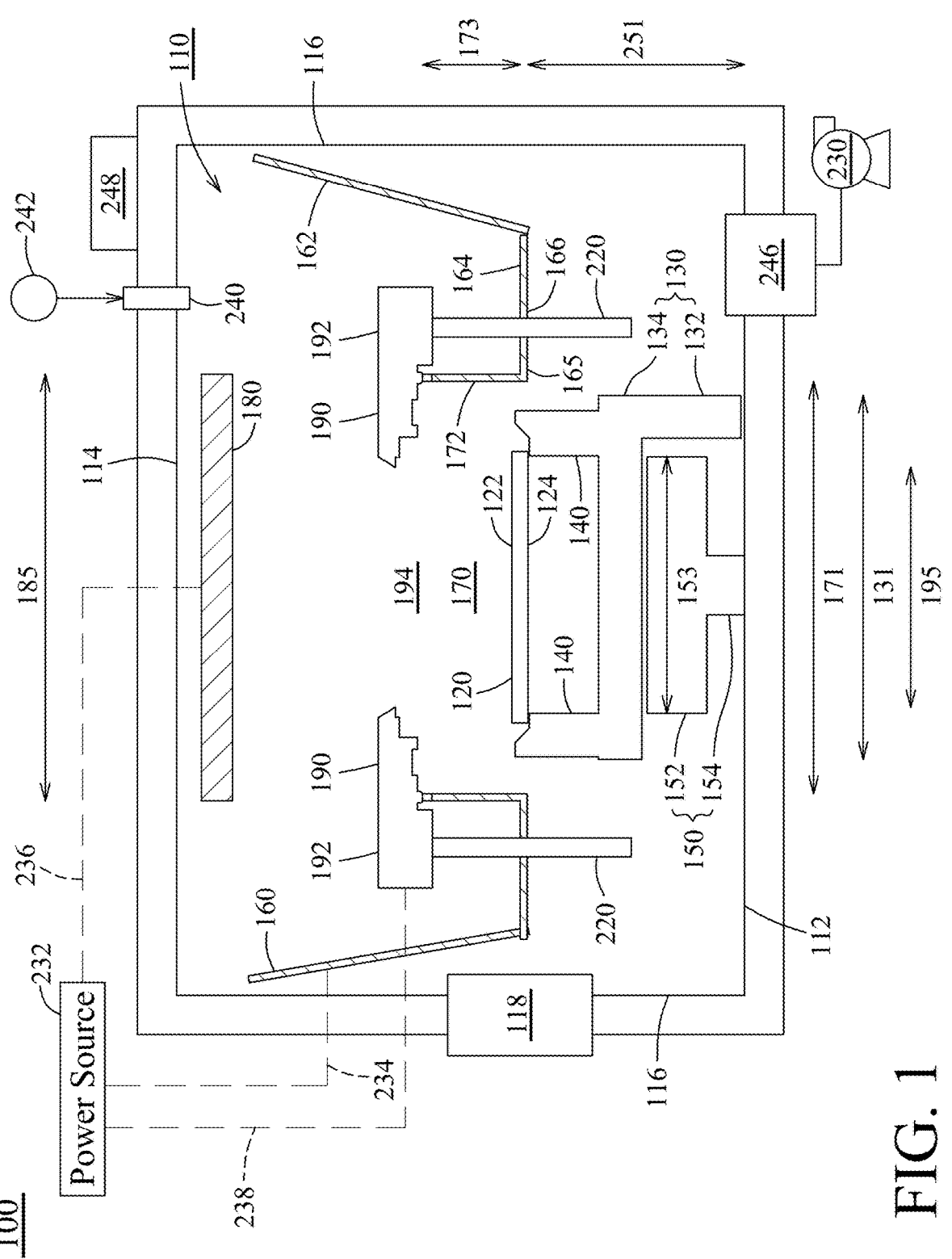
FIG. 1 is a cross-sectional view of a process chamber in a release or rest position, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

The term "about" can be used to include any numerical value that can vary without changing the basic function of that value. When used with a range, "about" also discloses the range defined by the absolute values of the two endpoints, e.g. "about 2 to about 4" also discloses the range "from 2 to 4." The term "about" may refer to plus or minus 10% of the indicated number.

The terms "inlet" and "outlet" are relative to a fluid flowing through them with respect to a given structure, e.g. a fluid flows through the inlet into the structure and flows through the outlet out of the structure. The terms "upstream" and "downstream" are also relative to the direction in which a fluid flows through various components, i.e. the fluid flows through an upstream component prior to flowing through the downstream component.

The present disclosure relates to structures which are made up of different layers. When the terms "on" or "upon" or "over" are used with reference to two different layers (including the substrate), they indicate merely that one layer is on or upon or over the other layer. These terms do not require the two layers to directly contact each other, and permit other layers to be between the two layers. For example all layers of the structure can be considered to be "on" or "over" the substrate, even though they do not all directly contact the substrate. The term "directly" may be used to indicate two layers directly contact each other without any layers in between them. In addition, when referring to performing process steps upon the substrate or over the substrate, this should be construed as performing such steps to whatever layers may be present on the substrate as well, depending on the context.

The present disclosure relates to devices and methods for performing deposition of a material layer upon a semiconducting wafer substrate. Material deposition is commonly used in integrated circuit fabrication, as are devices for performing such deposition. A variety of techniques may be used, including chemical vapor deposition (CVD) and physical vapor deposition (PVD). In CVD, the wafer substrate is exposed to at least one volatile precursor (i.e. in the gas phase) within a process chamber. The precursor reacts and/or decomposes on the substrate surface to produce the desired deposited layer. In PVD, material from a target is converted into a gas, which is then deposited upon the substrate.

The wafer substrate is usually held in close proximity to the target. However, due to constraints imposed by other components of the deposition device, the structure of the wafer holder is asymmetrical. In particular, a support shaft is located to one side of a hoop body upon which the wafer substrate is held. As a result, the far side of the wafer holder can sag. The wafer holder typically contacts a clamp which is used to hold the wafer substrate in place, and so one side of the clamp can also sag, especially after many operations. Layer uniformity is highly correlated with the clamp position. As a result of the sagging clamp, the uniformity of the layer across the wafer substrate is reduced, leading to lower device yield.

In the devices and methods of the present disclosure, the wafer holder is separated from the clamp during the deposition process. In addition, the structure of the clamp is modified. These changes increase process uniformity and reduce problems such as particle generation and wafer sticking.

FIG. 1 is a cross-sectional view of a deposition device 100 in a release or rest position, in accordance with some embodiments of the present disclosure. As illustrated here, the deposition device includes at least one process chamber 110. The process chamber 110 has a chamber bottom wall 112, a chamber top wall 114, and a chamber sidewall 116 connecting the chamber bottom wall 112 to the chamber top wall 114. A wafer inlet port 118 may be present in the chamber sidewall 116 to permit a substrate, such as semiconducting wafer substrate 120, to enter and exit the process chamber 110.

Figure 2:
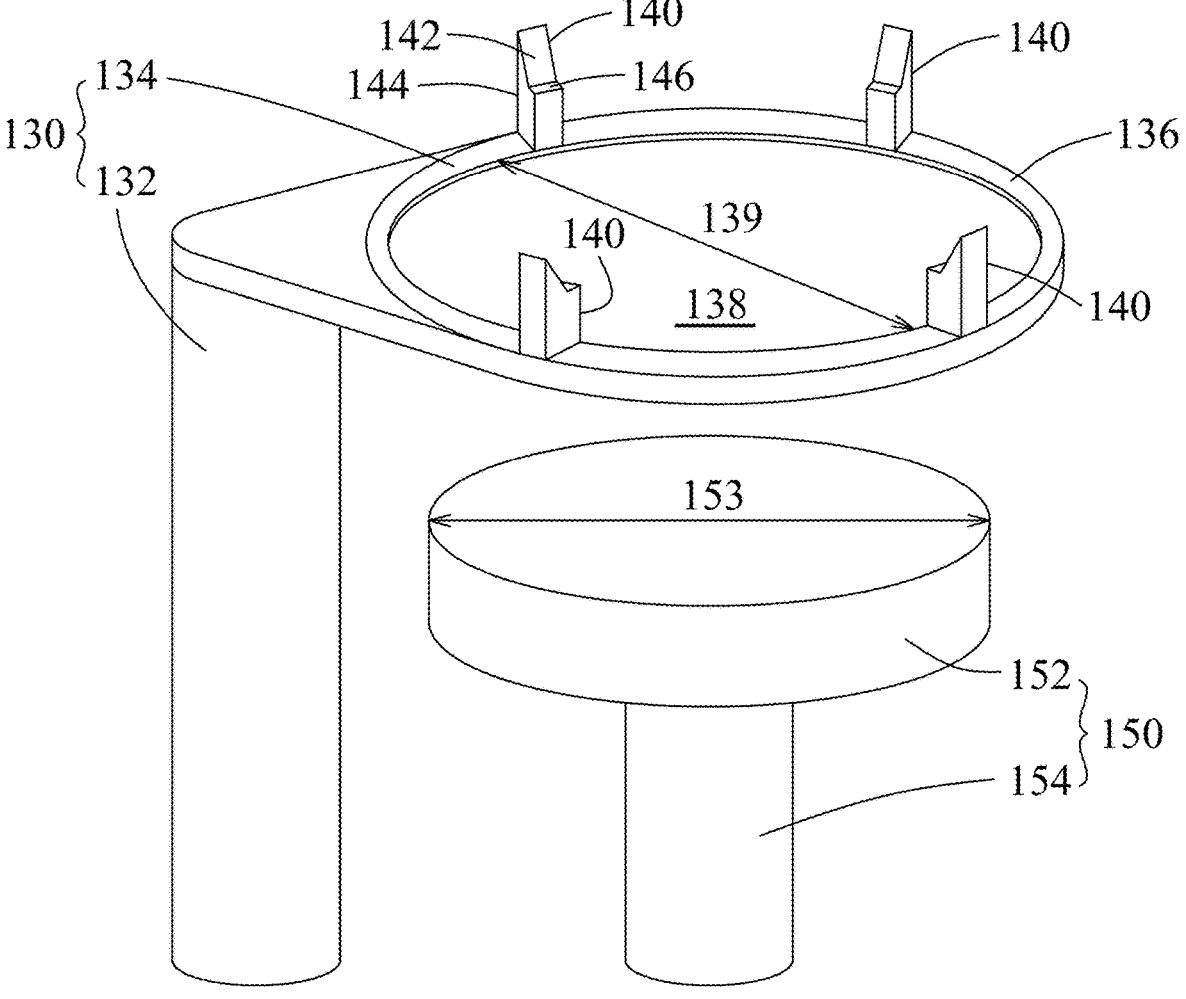
FIG. 2 is a perspective view of a wafer holder and a heater in the process chamber, showing additional details.

Referring to both FIG. 1 and FIG. 2, the deposition device 100 includes a wafer holder 130 disposed within the process chamber 110 along the bottom wall 112. The wafer holder includes a support shaft 132 which is connected to one side of a hoop body 134 and is coupled to a lift mechanism (not shown). The hoop body has an annular shape and surrounds a central aperture 138. A plurality of support fingers 140 extend upwards from an upper surface 136 of the hoop body 134. Four support fingers are illustrated. Each support finger may be described as having an angled surface 142 that angles downwards from an outer surface 144 of the finger to a horizontal surface 146. Thus, the wafer substrate 120 is self-centered upon the wafer holder 130.

The deposition device 100 also includes a heater 150 disposed within the process chamber 110 along the bottom wall 112. The heater 150 includes a pedestal 152 supported by a shaft 154 which is coupled to a lift mechanism (not shown). The heater 150 is aligned so as to pass through the central aperture 138 of the hoop body 134 of the wafer holder 130. The pedestal has a diameter 153 that is less than the diameter 139 of the central aperture of the hoop body. The heater heats the substrate during processing.

Continuing, and referring back to FIG. 1, an annular shield 160 is present above the wafer holder 130. The annular shield is formed from a sidewall 162 that extends downwards to a horizontal wall 164 that forms a lower surface of the shield. A plurality of pin openings 166 are also present in the horizontal wall 164 as well. The annular shield is used to contain particles generated during the deposition process within a controlled volume and reduce contamination outside of that controlled volume.

A central opening 170 is present in the annular shield. A vertical sidewall 172 surrounds the central opening 170. The vertical sidewall 172 is connected to an inner end 165 of the horizontal wall 164. The central opening 170 has a diameter 171 which is larger than a diameter 131 of the wafer holder 130. In some particular embodiments, the height 173 of the vertical sidewall 172 is from 2.2 centimeters (cm) to about 4 cm. However, other ranges and values are contemplated.

As illustrated here, a sputtering target 180 is located above the wafer holder 130 and the heater 150 along the chamber top wall. The target has a diameter 185 which is greater than the diameter 171 of the central opening 170 of the annular shield. The target 180 may be made, for example, of a metal such as copper, aluminum, nickel, chromium, gold, germanium, silver, titanium, tungsten, platinum, tantalum, ruthenium, cobalt, rhenium, palladium, or zirconium; or alloys such as titanium-tungsten (TiW) alloy, aluminum-copper (AlCu).

Figure 3A:
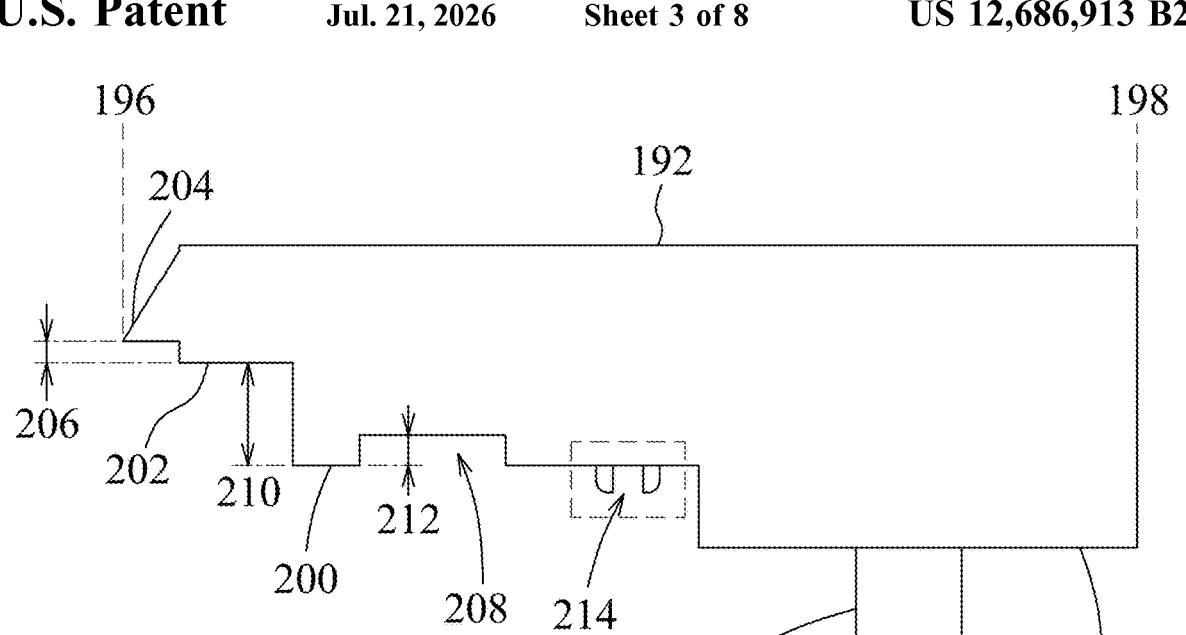
FIG. 3A is a cross-sectional view of a clamp used in the process chamber, showing additional details.

Referring now to FIG. 1 and FIG. 3A, a clamp 190 is located between the chamber top wall 114 and the annular shield 160. The clamp 190 comprises a ring body 192 which surrounds a central opening 194. The diameter 195 of the central opening 194 of the clamp is less than the diameter 131 of the wafer holder 130, and is also less than the diameter 153 of the pedestal 152 of the heater 150. A plurality of alignment pins 220 extend from the lower surface 200 of the ring body 192. Each alignment pin 220 passes through a pin opening 166 in the horizontal wall 164 of the annular shield. Each alignment pin is also electrically insulated to avoid creating a path between the annular shield 160 and the clamp 190. As seen in FIG. 1, the ring body 192 extends over the vertical sidewall 172 and over the central opening 170 of the annular shield.

Referring now more specifically to FIG. 3A, the ring body 192 has an inner side 196 and an outer side 198. The lower surface 200 of the ring body 192 is not a flat surface, but is contoured. Beginning proximate the inner side, the lower surface includes a wafer contact surface 202 which will contact the wafer substrate. An overhang 204 extends beyond the wafer contact surface 202, and is used to shield the wafer contact surface from particles generated by the sputtering target. This reduces the number of particles that may contact the interface between the clamp 190 and the wafer substrate 120 and cause sticking between them. The overhang 204 has a height 206 over the wafer contact surface 202.

Continuing, the lower surface includes a wafer holder contact groove 208. There is a height 210 between the wafer contact surface 202 and the lower surface proximate the wafer holder contact groove 208. The wafer holder contact groove 208 itself has a height 212.

Figure 3B:
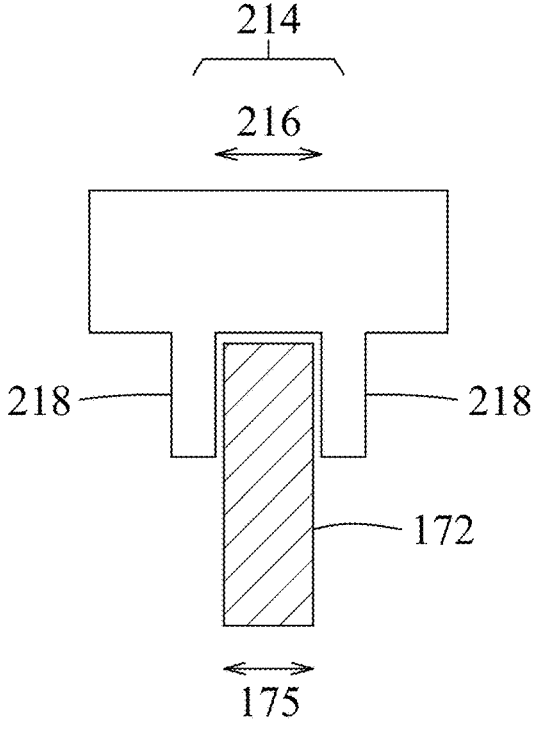
FIG. 3B is a magnified view of a portion of the clamp, showing the groove in the clamp.

Next, the lower surface includes an annular shield groove 214. This groove will engage the vertical sidewall 172 of the annular shield in the rest position of FIG. 1A, as more particularly illustrated in the magnified view of FIG. 3B. In particular embodiments, the groove 214 has a width 216 which is greater than the width 175 of the vertical sidewall 172. In more particular embodiments, the width 216 of the groove is about 5 millimeters (mm) or less. Similarly, the width 175 of the vertical sidewall is about 5 mm or less. The groove may be described as being formed by two tenons 218 extending from the lower surface 200. Finally, alignment pins 220 engage the lower surface 200 proximate the outer side 198 of the ring body. In particular embodiments, there are two to four alignment pins, although other values are contemplated as well.

Referring back to FIG. 1, the process chamber is vacuum-tight. A pump 230 is present for reducing the pressure within the process chamber. A power source 232 may be electrically connected to the annular shield 160 along one circuit 234 to ground the annular shield. The power source may be electrically connected to the target 180 along a different circuit 236 to create a voltage potential between the annular shield 160 and the target 180. A third circuit 238 may be used to apply a bias voltage to the clamp 190 and through the clamp to the wafer substrate 120. One or more gas inlets 240 may be connected to a gas source 242 for providing process gas, cleaning gas, etc. One or more gas outlets 246 may also be present for removing undesired gases, and may also be connected to the pump 230. The various components of the process chamber are made using appropriate materials for the process conditions that will arise.

A controller 248 is used to control the various inputs and outputs, and to measure various conditions within the process chamber. The system may also include sensors (not shown) for monitoring applicable parameters. For example, such sensors may include those for tracking the flow rate of various gases, for measuring the content of gases exiting the process chamber, for measuring the pressure within the process chamber, the temperature of the wafer substrate, the temperature of the process chamber, etc. The controller can also determine whether to activate or deactivate the process chamber, how to vary the voltage within each circuit, how to vary the gas mixture, potentially also control the motion of any automated handling system that may be present, etc. It is noted that these various parameters may not have to be held steady during operation, and could be changed by the controller operating a computer program which alters their setpoints as appropriate. The controller may also include a user interface for communicating with operators. If desired, different controllers may be used for controlling the cooling chamber and the plasma treatment chamber.

The controller may be implemented on one or more general purpose computers, special purpose computer(s), a programmed microprocessor or microcontroller and peripheral integrated circuit elements, an ASIC or other integrated circuit, a digital signal processor, a hardwired electronic or logic circuit such as a discrete element circuit, a programmable logic device such as a PLD, PLA, FPGA, Graphical card CPU (GPU), or PAL, or the like. Such devices typically include at least memory for storing a control program (e.g. RAM, ROM, EPROM) and a processor for implementing the control program.

Figure 4:
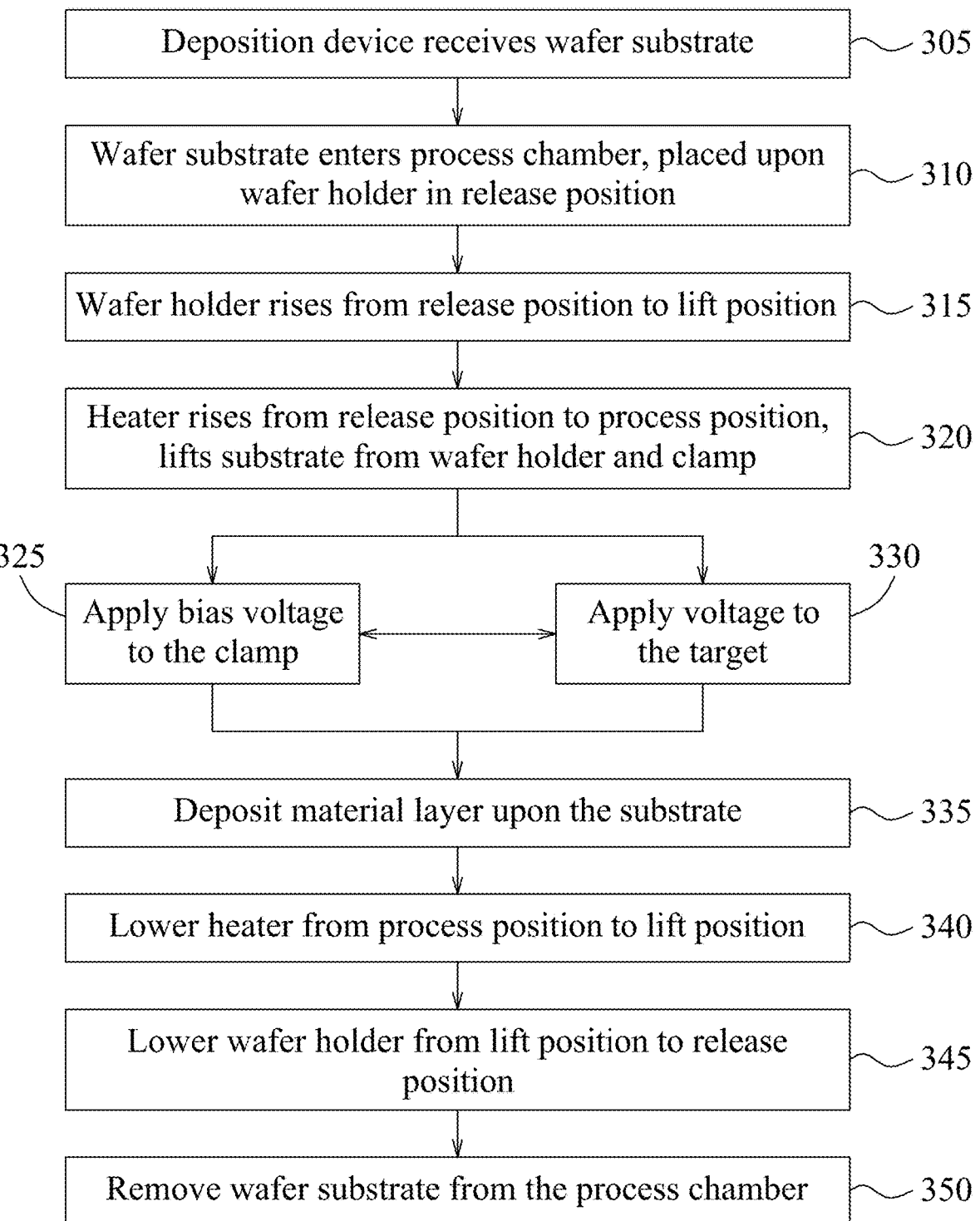
FIG. 4 is a flow chart illustrating a first method for performing deposition upon a wafer substrate, in accordance with some embodiments.

FIG. 4 is a flow chart illustrating a first method 300 for performing deposition upon a wafer substrate, in accordance with some embodiments. Some steps of the method are also illustrated in FIG. 1 and FIGS. 5-7. These figures provide different views for better understanding, and not all components are shown in all figures. It is noted that not all steps described in the flow chart are required, and that additional processing steps not described may also occur between the steps that are described.

Initially, FIG. 1 shows the various components of the process chamber 110 of the deposition device 100 in a in a first position, also referred to herein as a rest or release position. The heater 150 and the wafer holder 130 are relatively low, and are not engaging the clamp 190. The clamp 190 is engaging the vertical sidewall 172 of the annular shield 160 via groove 214 (see FIG. 3B).

In step 305 of FIG. 4, the device 100 receives a wafer substrate 120. For example, the device may include a load-lock chamber. In step 310, the wafer substrate 120 is placed upon the wafer holder 130 in the release position. For example, the wafer substrate may be transferred from the load-lock chamber into the process chamber 110. FIG. 1 illustrates the device after this step. The semiconducting wafer substrate 120 is illustrated here resting upon the horizontal surfaces 146 of the support fingers 140 (see FIG. 2) of the wafer holder 130. Deposition of a material layer will occur upon the substrate. The substrate may be, for example, a wafer made of a semiconducting material. Such semiconductor materials can include silicon, for example in the form of crystalline Si. In alternative embodiments, the substrate can be made of other elementary semiconductors such as germanium, silicon carbide (SiC), silicon germanium, or silicon germanium carbide. The substrate may alternatively include a compound semiconductor such as gallium arsenide (GaAs), gallium phosphide, gallium carbide, indium arsenide (InAs), indium phosphide (InP), gallium arsenic phosphide, gallium indium phosphide, cadmium telluride, or cadmium sulfide. In particular embodiments, the substrate is silicon. The wafer substrate 120 has an upper surface 122 and an opposite lower surface 124. The support fingers 140 are contacting the lower surface 124 along the perimeter of the wafer substrate. The heater 150 does not contact the wafer substrate 120 in the release position. The release position is indicated here by the height 251 of the substrate 120 relative to the bottom wall 112.

Figure 5:
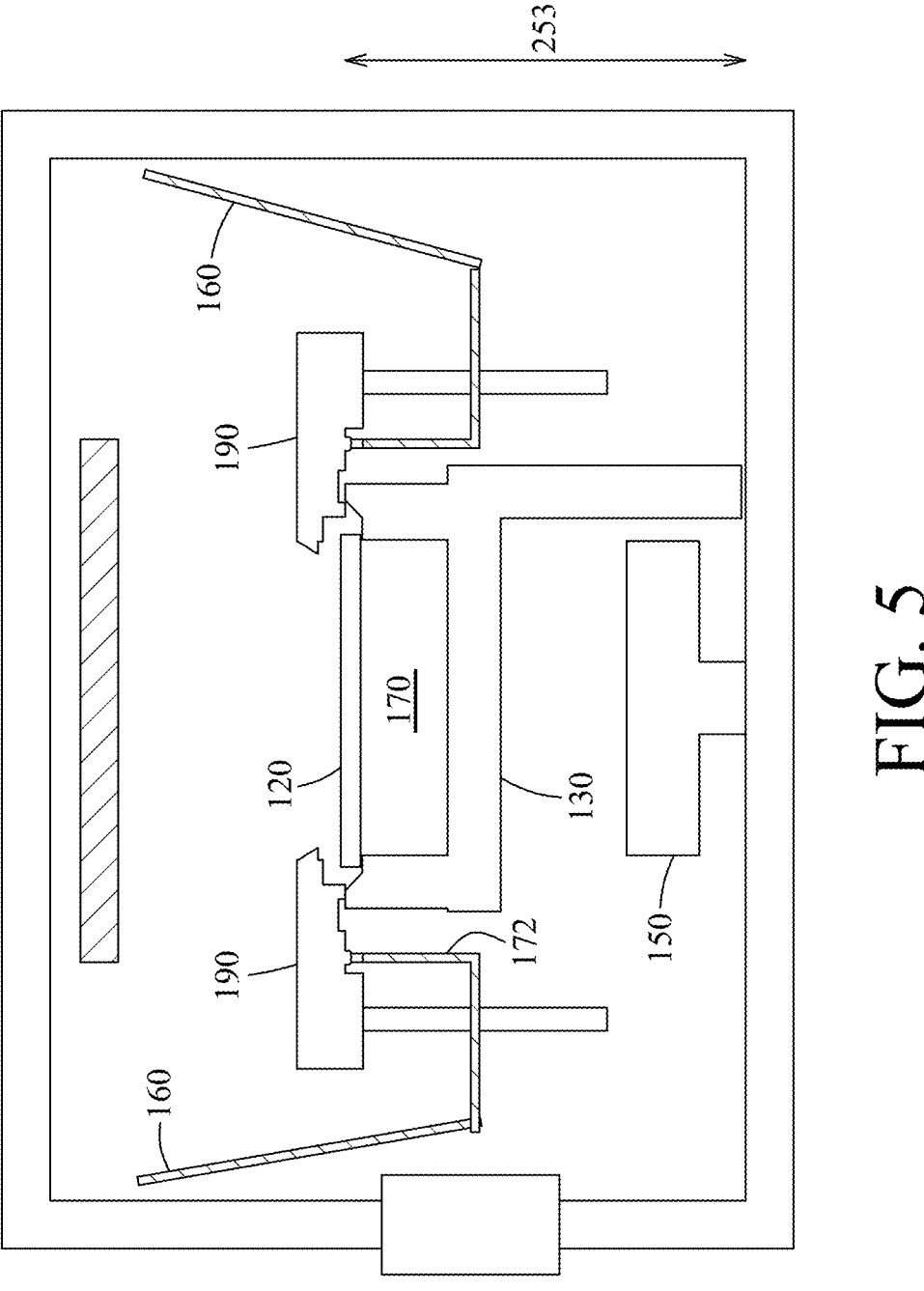
FIG. 5 is a cross-sectional view of the process chamber in a lift position.

Next, in step 315 of FIG. 4 and with reference to FIG. 5, the wafer holder 130 rises or is raised from the release position to a lift position. In doing so, the wafer holder passes through the central opening 170 in the annular shield 160. The lift position is indicated here with reference numeral 253, again based on the location of the substrate 120. In the lift position, the wafer holder 130 engages the clamp 190. The heater 150 has not moved, and is still in the same location as in the release position. Although the clamp 190 is illustrated here as still engaging the vertical sidewall 172, this is not required, and the clamp may be lifted off of the vertical sidewall in the lift position.

Figure 6:
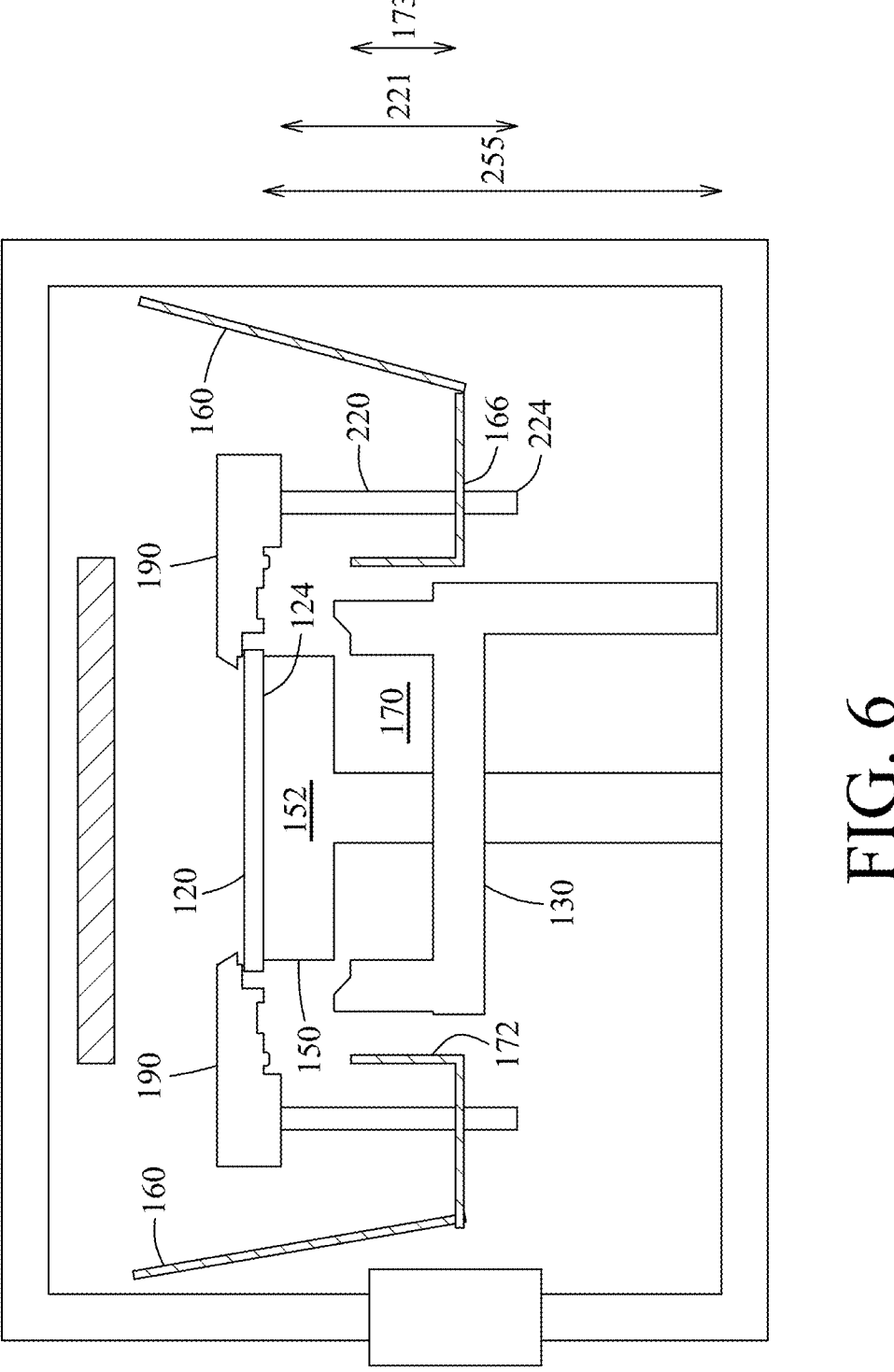
FIG. 6 is a cross-sectional view of the process chamber in a process position.

Then, in step 320 of FIG. 4 and with reference to FIG. 6, the heater 150 rises or is raised from the release position to a process position. In doing so, the heater passes through the central aperture 138 in the wafer holder 130 and also through the central opening 170 in the annular shield 160. The pedestal 152 of the heater engages the lower surface 124 of the substrate and lifts the substrate off of the wafer holder. As the heater 150 rises, the clamp 190 is engaged by the perimeter of the wafer substrate 120 and rises along with the heater. As a result, the wafer holder 130 no longer engages the clamp. The clamp also no longer engages the vertical sidewall 172 of the annular shield 160. The process position is indicated here with reference numeral 255, again based on the location of the substrate 120. It is noted that the wafer holder may remain in the lift position.

It is noted that the alignment pins 220 have a height 221 such that the lower ends 224 of the alignment pins (distal from the ring body) do not contact the annular shield 160 or exit the pin opening 166 when the substrate is in the process position. Rather, the lower ends 224 of the alignment pins remain below the annular shield 160. This reduces particle generation that might occur due to vibration of the annular shield.

As previously mentioned, in some particular embodiments, the height 173 of the vertical sidewall 172 is from 2.2 cm to about 4 cm. In addition, in some particular embodiments, the height 221 of the alignment pins is from 6.2 cm to about 8 cm. In more particular embodiments, the sum of their heights (i.e. height 173 plus height 221) is greater than 8.2 cm. In additional embodiments, the ratio of the alignment pin height 221 to the vertical sidewall height 173 is greater than 2.9, including greater than 3.0. Other ranges and values are also within the scope of the present disclosure.

Figure 7:
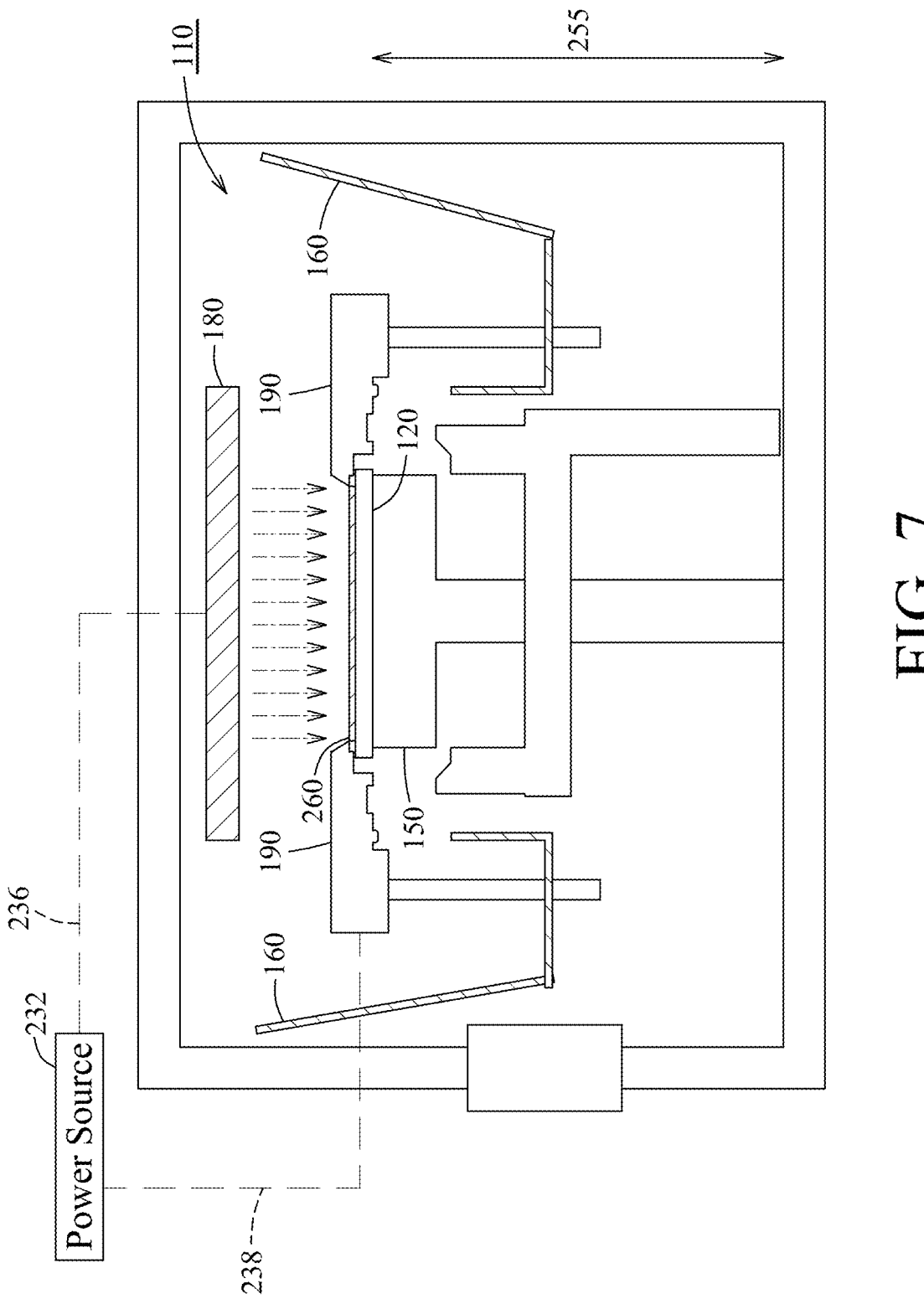
FIG. 7 is a cross-sectional view of the process chamber illustrating deposition of a material layer upon a wafer substrate.

Next. in step 325 of FIG. 4 and with reference to FIG. 7, a bias voltage is applied to the clamp 190 and thus to the wafer substrate 120. This may be done via circuit 238. In step 330 of FIG. 4, a voltage is applied to the target 180 via circuit 236. This creates an electric field within the process chamber that directs ions towards the target to sputter metal ions or atoms. These steps may be performed in either order or concurrently. Then, in step 335 of FIG. 4, a material layer 260 is deposited upon the wafer substrate 120. The material layer may be in the form of a thin film, and may have any desired thickness. The annular shield prevents the material layer from being formed on the chamber walls.

In PVD, the deposition process generally occurs in a vacuum atmosphere (for example, in the range of about $10^{-6}$ torr). In a sputtering process, inert gas molecules, such as argon ($Ar_2$) or nitrogen ($N_2$), are released into the process chamber 110 between the target 180 and the annular shield 160. The inert gas molecules are then ionized in an electric field to produce a gas plasma. The plasma ions are then directed towards the target. High energy collisions of the plasma atoms dislodge atoms of the target, which then land on the substrate. In electron-beam evaporation, the target is bombarded with an electron beam to create vapor from the target. In thermal evaporation, the target material is placed in a crucible or formed as a filament, which is then radiatively heated to create the vapor. PVD typically operates on a line-of-sight basis as well. The clamp 190 holds the wafer substrate 120 in place when gas is introduced into the process chamber, which can apply pressure between the heater 150 and the wafer substrate 120 itself.

Continuing, then, in step 340 of FIG. 4, after the material layer has been formed, the wafer substrate 120 is lowered from the process position 255 back down to the lift position 253. This is done by lowering the heater 150. The wafer substrate 120 and the clamp 190 travel along with the heater. The wafer substrate 120 again rests upon the wafer holder 130. The lift position is illustrated in FIG. 5.

Then, in step 345 of FIG. 4, the wafer holder 130 is lowered from the lift position down to the release position 251. The wafer substrate 120 travels with the wafer holder. The release position is illustrated in FIG. 1. The annular shield groove 214 again engages the vertical sidewall 172 of the annular shield 160 (see FIG. 3B). Finally, in step 350 of FIG. 4, the wafer substrate is removed from the process chamber.

Additional processing steps may be performed to fabricate a semiconductor device or integrated circuit. Examples of such steps may include ion implantation, deposition of other materials, etching, etc.

Figure 8:
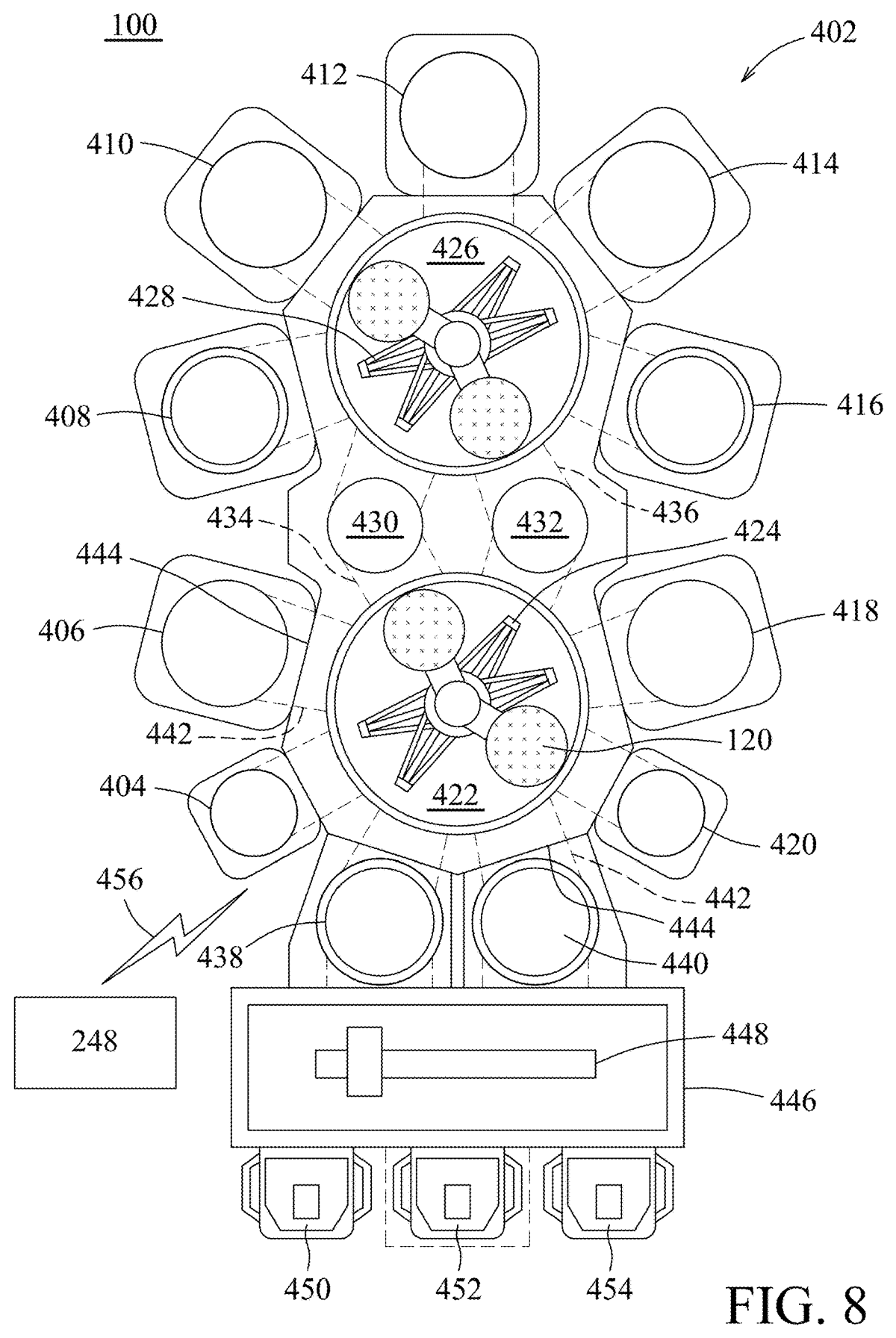

FIG. 8 is a plan view of one embodiment of a deposition device 100 which may include one or more process chambers as described above. The device 100 includes a main body 402 and a plurality of process chambers 404, 406, 408, 410, 412, 414, 416, 418, 420 coupled to the main body so that semiconducting wafer substrates undergoing processing can be robotically transferred between the various process chambers. It will be appreciated by those skilled in the art that the number and types of process chambers may vary in accordance with the manufacturing requirements of a particular fab.

The deposition device 100 is capable of producing layers of various materials stacked upon one another on a substrate without exposing the substrate to the pressure and contaminants of ambient air until the stack is complete. Thus, the process chambers may include, for example, at least one metal deposition chamber 406 and at least one dielectric layer deposition chamber 408 for depositing layers in a stack. In other embodiments, one or more of the process chambers 404-420 may include a sputtering target for depositing material onto the stack.

The main body 402 of the device includes a first robot buffer chamber 422 housing a first robot 424 and a second robot buffer chamber 426 housing a second robot 428. Each of the first and second robots 424, 428 may be configured to transfer a wafer substrate 120 between various process chambers. The main body 402 may further include a pair of intermediate processing or treatment chambers 430, 432 which further enable transfer of a wafer substrate 120 between the first and second robot buffer chambers 424, 428.

As illustrated here, the first intermediate processing or treatment chamber 430 is located within a tunnel or passageway 434 connecting the first robot buffer chamber 422 to the second robot buffer chamber 426. Similarly, the second intermediate processing or treatment chamber 432 is positioned within a separate passageway 436 connecting the first robot buffer chamber 422 to the second robot buffer chamber 426. In accordance with one embodiment, these separate passageways 434, 436 between the two robot buffer chambers 422, 426 permit one passageway to be used for loading and the other passageway for unloading, or vice versa, while processing occurs in the process chambers. According to some embodiments, the intermediate processing or treatment chambers 430, 432 may be configured for pre-treating of a wafer substrate 120 (e.g., remote plasma etch cleaning, heating, etc.) before processing in one or more of the process chambers 404-420 and/or for post-treating of a wafer substrate 120 (e.g., cool-down) after treatment in one or more of the process chambers 404-420.

In accordance with some embodiments, the device 100 may utilize a plurality of different process chambers. For example and without limitation, process chambers 404, 420 may be implemented to perform high temperature degas annealing. For example, such process chambers 404, 420 may be implemented as Collins or pre-clean chambers, e.g., PVD chambers. Further, different process chambers may be used for deposition of different materials. For example, process chambers 410, 418 may be used to deposit a silicon-cobalt-nickel (SiCoNi) layer, whereas process chambers 412, 416 may be used to deposit a high bottom coverage (HBC) titanium layer. Some process chambers 414 may be used to perform other processes, such as chemical vapor deposition (CVD). The skilled artisan will appreciate that the types of chambers and the processes performed therein (as well as the materials deposited on the wafer substrate 120) may be modified in accordance with the type of semiconductor device being manufactured, and the description above is intended as one possible configuration of the device 100 in accordance with varying embodiments of the subject application.

The main body 402 further includes one or more load lock chambers. Here, two load lock chambers 438, 440 are illustrated. In some embodiments, the two load lock chambers 438, 440 are mounted to the first robot buffer chamber 422 and in communication with the interior of the first robot buffer chamber via access ports 442 and associated gate valves 444 and to an equipment front end module (EFEM) 446. The EFEM 446 includes a robot 448 that is configured to transfer wafers, e.g., one at a time, from a front opening unified pod (FOUP) 450, 452, 454 to a load lock chamber 438, 440 of the main body 402. For example, it is contemplated that one load lock chamber 438 is used for loading of the device, and the other load lock chamber 440 is used for unloading of the device.

As mentioned above, the various process chambers 404-420 are attached around the first robot buffer chamber 422 and the second robot buffer chamber 426. Each of the various process chambers 404-420 may be adapted for various types of processing, e.g., etching, annealing, deposition, cleaning, etc. Again, access to and from the process chambers 404-420 may also be accomplished via associated access ports 442 and gate valves 444. Notably, the arrangement of the various chambers and layout of robotic transfer pathways of the device 100 should be understood to be a nonlimiting illustrative example, and other numbers and arrangements of chambers and other robotic transfer pathway layouts are contemplated.

In some embodiments contemplated herein, the device 100 may be operated such that each process chamber 404-420, robot buffer chamber 422, 426, intermediate processing or treatment chamber 430, 432, and/or load-lock chamber 438, 440 may be isolated from each other by gate valves or the like. Accordingly, it will be appreciated that the internal atmosphere in each of these chambers may be independently controlled, both in terms of gas composition and pressure. In some embodiments, variations in pressure levels may be minimized during wafer transfer via an associated vacuum pump or pumps (not shown), which may be configured to provide a vacuum gradient across the device from the load lock chambers 438, 440 to the process chambers 404-420.

Operation of the device 100 may be controlled by one or more controllers 248, shown here in data communication via a communications link 456. The communications link may be any suitable means of wired or wireless communication, including, for example and without limitation, the public switched telephone network, a proprietary communications network, infrared, optical, or other suitable wired or wireless data communications. In some embodiments, the various components of the device 100 are in communication with a distributed computing environment, e.g. a local area network, a wireless local area network, a virtual private network, a wide area network, or the like. In some embodiments, the controller 248 may be configured to control, for example and without limitation, operations of the EFEM 446 including the operations of the FOUPs 450, 452, 454, the front end robot 448, operations of the device 100 including the first and second robots 424, 428, the various pumps, gas supplies, valves and treatment equipment of the main body 402, as well as operations of the process chambers 404-420.

The process chambers and structures of the present disclosure have several advantages. They improve process uniformity and the uniformity of the resulting wafer substrates that integrated circuits/chips thereon by reducing sagging that occurs due to the off-center placement of the support shaft of the wafer holder. Hoop skew, clamp skew, and wafer map shift are all reduced. This also reduces wafer sticking and particle contamination, which improves yield and efficiency.

Some embodiments of the present disclosure thus relate to methods for improving deposition uniformity across a wafer substrate. The wafer substrate is placed upon a wafer holder in a release position. The wafer holder rises from the release position through a central opening in an annular shield to a lift position where the wafer holder engages a clamp. A heater rises through a central aperture in the wafer holder to lift the wafer substrate off the wafer holder and up to a process position where the heater and the clamp engage the associated wafer substrate and the wafer holder does not engage the clamp. A material layer is then deposited upon the wafer substrate.

Other embodiments disclosed herein relate to deposition devices comprising a process chamber. The process chamber contains a wafer holder, an annular shield, a clamp, and a heater. The wafer holder is configured to hold an associated wafer substrate, and comprises a hoop body around a central aperture. The annular shield comprises a lower surface with a plurality of pin openings therein and a vertical sidewall around a central opening. The clamp comprises a ring body having a lower surface, and a plurality of alignment pins extending from the lower surface and passing through the plurality of pin openings. The heater is configured to pass through the central aperture of the wafer holder. Each alignment pin has a length such that a lower end of the alignment pin does not contact the annular shield at a process position where the heater and the clamp engage the associated wafer substrate and the hoop does not engage the clamp.

Also described in various embodiments herein are methods for performing deposition upon a wafer substrate. The wafer substrate is received in a device as described above. The wafer holder rises from a release position to a lift position where the wafer holder engages the clamp. The heater rises through the central aperture in the wafer holder to lift the wafer substrate to a process position where the heater and the clamp engage the wafer substrate and the hoop does not engage the clamp. A material layer is then deposited upon the wafer substrate.

In particular embodiments, the lower surface of the clamp includes a groove that engages the vertical sidewall of the annular shield in a release position.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for improving deposition uniformity across a wafer substrate, comprising:
   placing the wafer substrate upon a wafer holder in a release position;
   raising the wafer holder from the release position through a central opening in an annular shield to a lift position where the wafer holder engages a clamp;
   raising a heater through a central aperture in the wafer holder to lift the wafer substrate off the wafer holder and up to a process position where the heater and the clamp engage the associated wafer substrate and the wafer holder does not engage the clamp;
   depositing a material layer upon the wafer substrate.

2. The method of claim 1, wherein the material layer is deposited by sputtering from a target above the wafer substrate.

3. The method of claim 1, wherein the material layer is deposited by evaporation from a target above the wafer substrate.

4. The method of claim 1, wherein the clamp comprises a ring body having a lower surface, and a plurality of alignment pins extending from the lower surface; and
   wherein the plurality of alignment pins passes through a plurality of pin openings in the annular shield;
   wherein each alignment pin has a length such that a lower end of the alignment pin does not contact the annular shield at the process position.

5. The method of claim 1, wherein the clamp further comprises a groove in a lower surface thereof, and the groove engages a vertical sidewall of the annular shield in the release position.

6. The method of claim 1, wherein the wafer holder comprises a hoop body around the central aperture.

7. The method of claim 6, wherein the wafer holder further comprises support fingers extending upwards from the hoop body.

8. The method of claim 1, further comprising applying a bias voltage to the clamp.

9. A method for performing deposition upon a wafer substrate, comprising:

receiving the wafer substrate in a device that comprises:

a wafer holder for holding the wafer substrate, comprising a hoop body around a central aperture;

an annular shield comprising a lower surface with a plurality of pin openings therein and a vertical sidewall around a central opening;

a clamp comprising a ring body having a lower surface with a groove that engages the vertical sidewall in a release position, and a plurality of alignment pins extending from the lower surface and passing through the plurality of pin openings; and a heater configured to pass through the central aperture of the hoop;

raising the wafer holder from the release position to a lift position where the wafer holder engages the clamp;

raising the heater through the central aperture in the wafer holder to lift the wafer substrate to a process position where the heater and the clamp engage the wafer substrate and the hoop does not engage the clamp; and depositing a material layer upon the wafer substrate.

10. The method of claim 9, further comprising:

lowering the wafer substrate from the process position to the lift position; and lowering the wafer holder from the lift position to the release position.

11. A method for performing deposition upon a wafer substrate, comprising:

raising a wafer holder holding the wafer substrate from a release position through a central opening in an annular shield to a lift position where the wafer holder engages a clamp;

raising a heater through a central aperture in the wafer holder to lift the wafer substrate off the wafer holder and up to a process position where the heater and the clamp engage the associated wafer substrate and the wafer holder does not engage the clamp;

depositing a material layer upon the wafer substrate.

12. The method of claim 11, wherein the material layer is deposited by sputtering from a target above the wafer substrate or by evaporation from a target above the wafer substrate.

13. The method of claim 11, wherein the clamp comprises a ring body having a lower surface, and a plurality of alignment pins extending from the lower surface; and wherein the plurality of alignment pins passes through a plurality of pin openings in the annular shield;

wherein each alignment pin has a length such that a lower end of the alignment pin does not contact the annular shield at the process position.

14. The method of claim 13, wherein each alignment pin is electrically insulated.

15. The method of claim 11, wherein the clamp further comprises a groove in a lower surface thereof, and the groove engages a vertical sidewall of the annular shield in the release position.

16. The method of claim 15, wherein the groove has a width of about 5 mm or less.

17. The method of claim 15, wherein the vertical sidewall of the annular shield has a height of about 2 cm to about 8 cm.

18. The method of claim 11, wherein the wafer holder comprises a hoop body around the central aperture.

19. The method of claim 18, wherein the wafer holder further comprises support fingers extending upwards from the hoop body.

20. The method of claim 11, further comprising applying a bias voltage to the clamp.

* * * * *